United States Patent
Lui et al.

(10) Patent No.: US 6,995,085 B2
(45) Date of Patent: Feb. 7, 2006

(54) UNDERLAYER PROTECTION FOR THE DUAL DAMASCENE ETCHING

(75) Inventors: Lawrence Lui, Panchiao (TW); Chia-Shia Tsai, Hsin-chu (TW); Chao-Cheng Chen, Tainan County (TW); Jen-Cheng Liu, Chia-Yi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 195 days.

(21) Appl. No.: 10/346,384

(22) Filed: Jan. 17, 2003

(65) Prior Publication Data

US 2004/0142554 A1 Jul. 22, 2004

(51) Int. Cl.
H01L 21/4763 (2006.01)

(52) U.S. Cl. .................. 438/633; 438/637; 438/643; 438/672; 438/675

(58) Field of Classification Search ............ 438/633, 438/637, 643, 672, 675, 687
See application file for complete search history.

(56) References Cited

U.S. PATENT DOCUMENTS

| | | | |
|---|---|---|---|
| 5,578,523 A | 11/1996 | Fiordalice et al. | |
| 5,635,423 A | 6/1997 | Huang et al. | 437/195 |
| 5,686,354 A | 11/1997 | Avanzino et al. | |
| 5,705,430 A | 1/1998 | Avanzino et al. | 437/195 |
| 5,741,622 A | 4/1998 | Arima | |
| 5,741,626 A | 4/1998 | Jain et al. | |
| 5,801,099 A | 9/1998 | Kim et al. | 438/666 |
| 5,933,761 A | 8/1999 | Lee | 438/783 |
| 5,935,762 A | 8/1999 | Dai et al. | |
| 6,495,451 B2 * | 12/2002 | Hattori et al. | 438/638 |
| 6,518,185 B1 * | 2/2003 | Wang et al. | 438/687 |
| 6,861,376 B1 * | 3/2005 | Chen et al. | |
| 2003/0091907 A1 * | 5/2003 | Horak et al. | 430/5 |

* cited by examiner

*Primary Examiner*—Hsien-Ming Lee
(74) *Attorney, Agent, or Firm*—Haynes and Boone, LLP

(57) ABSTRACT

A method of protecting an underlying diffusion barrier layer in a dual damascene trench and via etch process with a coating of negative photoresist. The dual damascene process starts with via hole etching in an intermetal dielectric (IMD) layer. Next, the thin film barrier layer is deposited and patterned to fill the bottom of the vias. The key process step is a coating of negative photoresist which is exposed and developed to partially fill the via openings. This thick layer of negative photoresist in the vias protects the thin diffusion barrier layer from subsequent dual damascene etch processing.

36 Claims, 2 Drawing Sheets

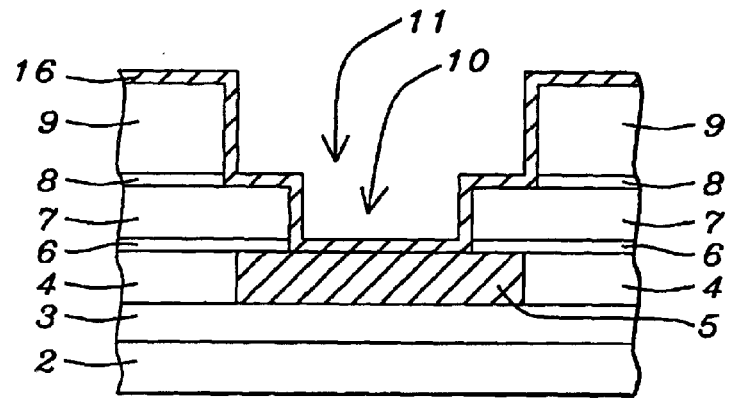
FIG. 1 – Prior Art
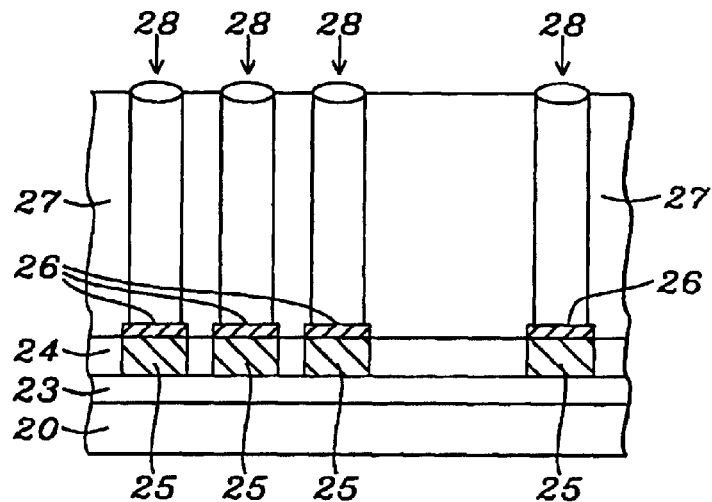
FIG. 2
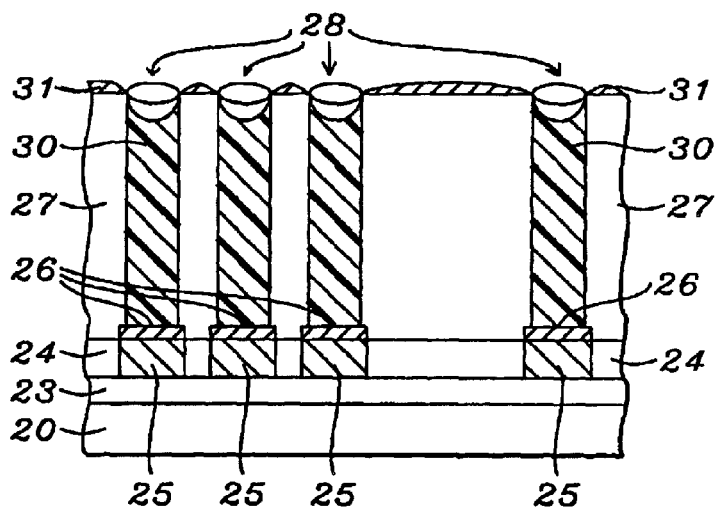
FIG. 3

UNDERLAYER PROTECTION FOR THE DUAL DAMASCENE ETCHING

BACKGROUND OF THE INVENTION (1) Field of the Invention

The present invention teaches a method of protecting an underlying diffusion barrier layer in a dual damascene trench and via etch process with a coating of negative photoresist, to solve this problem.

(2) Description of Related Art

As a background to the current invention, the damascene processing is a "standard" method for fabricating planar copper interconnects. Damascene wiring interconnects (and/or studs) are formed by depositing a dielectric layer on a planar surface, patterning it using photolithography and oxide reactive ion etch (RIE), then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices. In both examples, sputtered Ti/TiN liners, underlying diffusion barriers, have been coated with chemical vapor deposited (CVD) W metal, then polished back to oxide.

Chemical vapor deposition (CVD) of W usually requires an underlying conductive diffusion barrier and "seed" layers to prevent consumption of substrate Si from reaction with WF6 at the contact level, and to promote distributed nucleation and low contact resistance. A layer of Ti is used since it provides good adhesion and low contact resistance. However, the Ti alone is not sufficient, because the F from the $WF_6$ reacts with the Ti and produces a brittle, high-resistivity compound. However, the use of a TiN film between the Ti and W solves these problems by enhancing W nucleation while preventing the reaction of F with the Ti or any exposed Si. A W seed layer is then formed an the TiN. More recent processes use a copper seed layer on top of an underlying diffusion barrier (preventing diffusion at both interfaces blocking both copper and silicon diffusion) prior to a copper deposition by electrochemical deposition (ECD). Problems with protecting this underlying diffusion barrier during reactive ion etching (RIE) in the damascene process present some formidable processing challenges.

After conductive metal deposition by electrochemical deposition (ECD) of copper, for example, CMP is applied to complete the inlaid structure. In the CMP process, material is removed from the wafer through the combined effects of a polish pad and an abrasive slurry. The chemical dissolution of material is aided by a mechanical component which is useful in removing passivating surface layers. Chemical and mechanical selectivity's between materials are desired, since CMP must remove the excess metal without removing appreciable amounts of inlaid metal or reducing interconnect thickness.

In the dual-damascene process, a monolithic stud/wire structure is formed from the repeated patterning of a single thick oxide film followed by metal filling and CMP. First, a relatively thick oxide layer is deposited on a planar surface. The oxide thickness is slightly larger than the desired final thickness of the stud and wire, since a small amount of oxide is removed during CMP. Stud recesses are formed in the oxide using photolithography and RIE that either partially etches through the oxide or traverses the oxide and stops on the underlying metal to be contacted. The wire recesses can then be formed using a separate photolithography step and a timed oxide etching step. If the former stud RIE option is used, the wire etching completes the drilling of the stud holes. Problems can exist with protecting this underlying diffusion barrier during reactive ion etching (RIE) in the dual damascene process. For process integration issues, some diffusion barrier layers are deposited and patterned prior the reactive ion etching (RIE) process, in forming the dual damascene structures. Problems with protecting this underlying diffusion barrier during reactive ion etching (RIE) in the dual damascene process present some formidable processing challenges.

Next, the stud/wire metallization is deposited, then planarized using CMP. The resulting interconnects are produced with fewer process steps than with conventional processing and with the dual damascene process, two layer of metal are formed as one, i.e., wiring line and contact stud vias, avoiding an interface between the layers.

Another metal deposition, besides sputtering techniques, has been adapted as a standard for copper metallization. This technique, as mentioned earlier, is electrochemical copper deposition (ECD). It is used for the large grain size (low electromigration) and high deposition rates achieved. The electrochemical copper deposition (ECD) still needs sputtering techniques, physical vapor deposition (PVD), to deposit thin underlying diffusion barrier film (Ta, TaN) and a conductive "seed" layer of copper. As mentioned above, problems with protecting this underlying diffusion barrier during reactive ion etching (RIE) in the dual damascene process presents some formidable processing challenges.

Related patents and relevant literature now follow as Prior Art.

U.S. Pat. No. 5,705,430 entitled "Dual Damascene with a Sacrificial Via Fill" granted Jan. 6, 1998 to Avanzino et al. describes a dual damascene process with a sacrificial fill layer in the via opening. A dual damascene method of fabricating is described for interconnection level of conducting lines and connecting vias separated by insulation, for building integrated circuits with semiconductor devices, using a sacrificial via fill.

U.S. Pat. No. 5,635,423 Patent entitled "Simplified Dual Damascene Process for Multi-Level Metallization and Interconnection Structure" granted Jun. 3, 1997 to Huang et al. teaches a dual damascene process with a trench etch followed by a via etch. A semiconductor device containing an interconnect structure having a reduced interwiring spacing is produced by this modified dual damascene process, which uses an etch stop layer. The trench and via formed by this process are simultaneously filled with conductive metal.

U.S. Pat. No. 5,933,761 Patent entitled "Dual Damascene Structure and Its Manufacturing Method" granted Aug. 3, 1999 to Lee describes a dual damascene process with etch stops. The invention uses two ion implantation steps to form two etch stop layers. It uses the stop layers to perform an anisotropic etching step to form via and trench structures. Another feature reported is the use of a device sidewall spacer as a trench mask, instead of a multi-mask process, thereby preventing mask misalignment.

U.S. Pat. No. 5,801,099 Patent entitled "Method for Forming Interconnection of Semiconductor Device" granted Sep. 1, 1998 to Kim et al. describes a modified dual damascene process with a conductive plug filling the via opening. First and second trench regions are formed and filled with conductive material, thereby forming an upper conductive line.

SUMMARY OF THE INVENTION

The present invention teaches an integrated method of protecting an underlying diffusion barrier layer from dual damascene trench and via etch processing, using a coating of negative photoresist, to solve this process problem.

The first embodiment of the present invention, is the patterning and etching of a via/trench structure in an intermetal dielectric (IMD). Next, a diffusion barrier layer is deposited and patterned. The diffusion barrier is near bottom of via and is unprotected from subsequent dual damascene reactive ion etch (RIE) and other etch processing. For completeness, the building of the via/trench structure follows. Firstly, there is a semiconductor substrate with a deposited insulating layer. A metal interconnect is deposited (e.g., Cu, AlCu alloys, AlCuSi alloys) and patterned within a deposited insulating layer, e.g., $SiO_x$. This conducting material can be, for example, a polysilicon gate structure, silicide or W contact, or a P-N junction contact. An intermetal dielectric (IMD) is deposited, e.g., $SiO_x$. Patterning and reactive ion etching (RIE) of the via/trench in the intermetal dielectric is the next process step in building of the dual damascene structure. The next processing step is the deposition by sputtering (PVD, physical vapor deposition) and patterning of a thin metal barrier layer, forming a liner at the bottom of the trench.

The next process step is the main embodiment of the present invention. A negative photoresist is coated over and in via/trench region. This coating of negative photoresist is over the barrier layer in via/trench structure and protects the layer of the diffusion barrier underneath. The top surface of the intermetal dielectric (IMD) is also coated by the negative photoresist coating.

The next processing step of this invention is the via mask exposure and development of the negative resist, with most of the negative resist remaining in the via/trench structures, on top of the underlying bottom diffusion barrier layer (protecting the diffusion barrier). After resist exposure and develop, there is no resist remaining on the top surface of the intermetal dielectric (IMD) and some resist is removed from the tops of the via/trench structures. The key point of this invention is that the bottom diffusion barrier layer is protected from being etched away (in subsequent dual damascene etch steps) by the thick layer of negative photoresist in the via/trench structures.

A metal reverse tone photo processing step, to complete a dual damascene structure, is used. Photoresist is deposited and reverse mask patterned to etch a second layer of a deposited intermetal dielectric (IMD) (e.g. $SiO_x$) on the top surface of the first intermetal dielectric (IMD). This process forms the trench openings on top of the via openings. Note, that the barrier layer and vias remain protected, by the thick negative photo resist layer, from the dual damascene etch processing. Etch rate micro-loading factors for trench reactive ion etch (RIE) between isolation material and dense hole patterns are avoided by this process. Trench and via sidewall profiles are maintained and improved by this dual damascene process. In yet another embodiment of this invention, negative resist can be used in this reverse tone photo processing of the top metal trench patterning.

A summary of the final processing steps of this invention follow. The negative photo resist in the via and all photo resist is stripped from the via/trench regions by, for example, a plasma ashing. A copper seed layer, which lines the via/trench regions and is on the barrier layer, is deposited. Typical deposition conditions for thin copper seed layer are similar to those used for the barrier layer, with copper seed layer film thickness ranging from 500 to 3,000 Angstroms. The next processing step in building of the dual damascene structure, is the preferential deposition of copper, upon the seed layer and barrier layer, by electrochemical copper deposition (ECD). The final processing step in building the dual damascene structure, is the chemical mechanical polishing (CMP) back of the excess electrochemical deposited copper metal, with the copper remaining inlaid in the open trench and via regions.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIG. 1, which in cross-sectional representation, illustrates Prior Art methods, as background to the present invention, forming a dual damascene structure of via and trench over a copper interconnect.

FIG. 2, which illustrated in cross-sectional drawing, is the via etch process with a patterned layer of the diffusion barrier underneath, unprotected from subsequent reactive ion etch (RIE) and other etch processing.

FIG. 3, which illustrated in cross-sectional drawing, is the negative photoresist coating of the via/trench, protecting the bottom layer of the diffusion barrier underneath from subsequent etch steps.

DESCRIPTION OF THE PREFERRED EMBODIMENT

Figure 4:
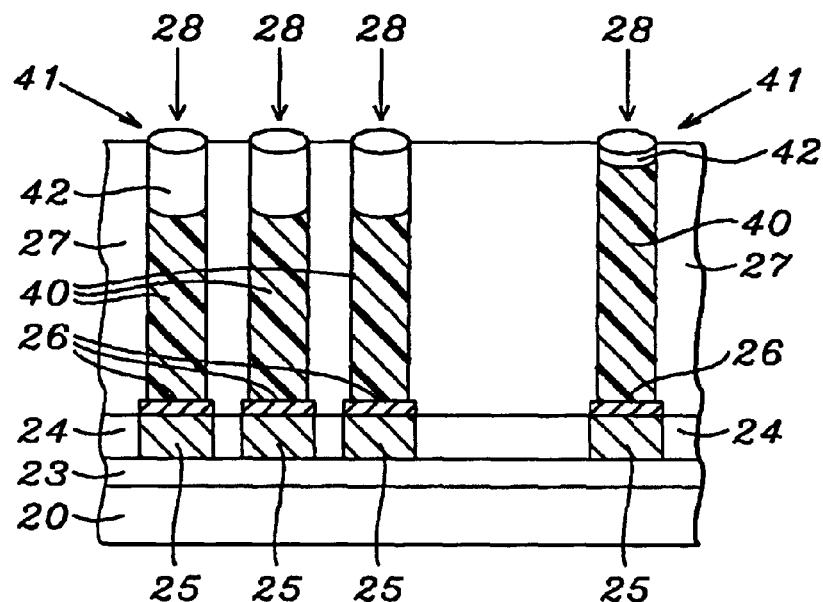
FIG. 4, which illustrated in cross-sectional drawing, is the next processing step, the via mask exposure and development of the negative resist, with most of the negative resist remaining in a trench structures, on top of the underlying diffusion barrier layer (protecting the diffusion barrier from subsequent dual damascene etching).

The present invention teaches a new and improved method of protecting an underlying diffusion barrier layer in a dual damascene trench and via etch process with a coating of negative photoresist, to solve this process problem.

Referring to FIG. 1 illustrated in cross-sectional drawing, as background and provided by Prior Art methods to is a standard dual damascene structure comprising a semiconductor substrate 2 with an insulating layer 3. A copper metal interconnect 5 is shown patterned within an insulating layer 4, e.g., $SiO_x$. In addition, two layers of dielectric 7 and 9 ($SiO_x$) are deposited and patterned with via 10 and trench 11 opening. Also provided by Prior Art methods, are via etch stop layer 6 and trench etch stop layer 8, e.g., silicon oxy-nitride, SiON. These Prior Art method provide the dual damascene structure shown in the FIG. 1.

Still referring to FIG. 1, illustrated in cross-sectional drawing, as background and provided by Prior Art methods to the present invention, is the etch back and removal by dry etch, reactive ion etch (RIE), of the etch stop layers 6 and 8 in the exposed via and trench regions. In addition, the next processing step in building of the dual damascene structure, is the deposition by sputtering (PVD, physical vapor deposition) and patterning of a thin metal barrier layer (trench liner), e.g. Ta, TaN, and thin copper seed layer 16, for subsequent electrochemical copper deposition (ECD), which occurs as the next process step in the sequence of process steps.

Again referring to FIG. 1, the next processing step in building of the dual damascene structure, is the deposition of copper (not shown in figs.) upon the seed layer 16 and barrier layer, by electrochemical copper deposition (ECD). The final processing step in building of the dual damascene structure, the chemical mechanical polishing (CMP) back of the excess electrochemical deposited copper metal, with After the special annealing treatment, the copper is planarized with the surface and chem-mech polished back, with the copper remaining inlaid in the open trench and via regions.

Referring to FIG. 2, which illustrated in cross-sectional drawing, is shown the first embodiment of the present invention, the via/trench 28 pattern and etch process in a layer of intermetal dielectric 27. Next, a diffusion barrier layer 26 is deposited and patterned in the via. The diffusion barrier 26 near bottom of via 28, is unprotected from subsequent dual damascene reactive ion etch (RIE) and other etch processing. For completeness, the building of the via structure in FIG. 2 depicts the following processing sequence. Firstly, there is a semiconductor substrate 20, or an IC module, with a deposited insulating layer 23. A metal interconnect 25 is deposited, selected from the group comprised of: Cu and AlCu alloys, AlCuSi alloys, and patterned within a deposited insulating layer 24, e.g., SiOX. This conducting material 25 can also comprised of a polysilicon gate structure, silicide or W contact, or a P-N junction contact. An intermetal dielectric 27 is deposited, comprised of $SiO_x$. Patterning and reactive ion etching (RIE) of the via/trench 28 in the intermetal dielectric 27 (IMD), is the next process step in building of the dual damascene structure. The next processing step is the deposition by sputtering (PVD, physical vapor deposition) and patterning of a thin metal barrier layer 26 (bottom of trench liner), selected from the group comprised of: Ta and TaN. Note, the barrier layer 26 is too thin to be illustrated in the entire via as a liner in the Figs.

Referring again to FIG. 2, the deposition and patterning of the barrier layer 26, Ta, and TaN, contains these typical conditions: physical vapor deposition (PVD), DC reactive sputtering with Ar, $N_2$ gases, pressure from about 10 to 500 mTorr, power from about 100 to 2,000 Watts, deposition rates from 100 to 2,000 Angstroms/min, with a film thickness range from 500 to 3,000 Angstroms.

Referring to FIG. 3, which illustrated in cross-sectional drawing, is the main embodiment of the present invention, the negative photoresist coating 30 of the via/trench 28, which protects the layer of the diffusion barrier 26 underneath. The top surface 31 of the intermetal dielectric 27 (IMD) is also coated by the negative photoresist coating.

Referring to FIG. 4, which illustrated in cross-sectional drawing, is the next processing step of this invention, the via mask exposure and development of the negative resist, with most of the negative resist remaining in the via/trench structures 40, on top of the underlying bottom diffusion barrier layer 26 (protecting the diffusion barrier). There is no resist remaining on the top surface 41 of the intermetal dielectric 27 (IMD) and some resist has been removed from the tops 42 of the via/trench structures 28. The key point of this invention is that the bottom diffusion barrier layer 26 is protected from being etched away (in subsequent dual damascene etch steps) by the thick layer of negative photoresist 40 in the via/trench structures.

Figure 5:
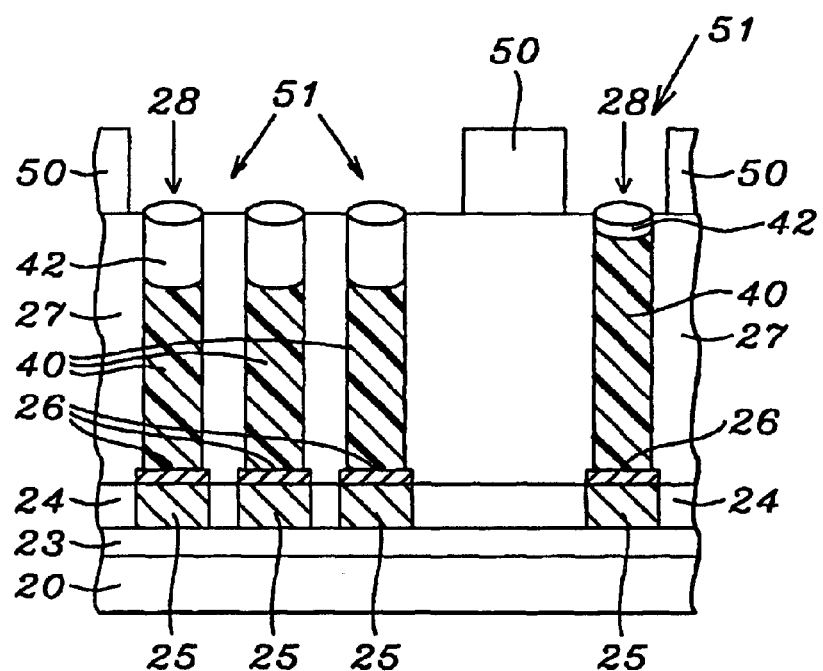
FIG. 5, which illustrated in cross-sectional drawing, shows the result of a metal reverse tone photo processing step, wherein the subsequent conducting metal is reverse mask patterned on the top surface for dual damascene trench formation.

FIG. 5, which illustrated in cross-sectional drawing, shows the result of a metal reverse tone photo processing step, to complete a dual damascene structure. Photoresist is deposited and reverse mask patterned to etch a second layer of a deposited intermetal dielectric 50 (IMD) (e.g. $SiO_x$) on the top surface of the first intermetal dielectric 27 (IMD). This process forms the trench 51 openings on top of the via 28 openings. Note, that the barrier layer 26 and vias 28 remain protected, by the thick negative photo resist layer 40, from the dual damascene etch processing. Etch rate microloading factors for trench reactive ion etch (RIE) between isolation material and dense hole patterns are avoided by this process. Trench and via sidewall profiles are maintained and improved by this dual damascene process. In yet another embodiment of this invention, negative resist can be used in this reverse tone photo processing of the top metal trench patterning.

Again, referring to FIG. 5, the final processing steps of this invention follow. The negative photo resist 40 in the via and all photo resist is stripped from the via/trench regions by, for example, a plasma ashing. A copper seed layer, which lines the via/trench regions and is on the barrier layer 26, is deposited.

Typical deposition conditions for thin copper seed layer, used for subsequent electrochemical copper deposition (ECD), are physical vapor deposition (PVD) DC reactive sputtering with Ar gas, pressure from about 10 to 500 mTorr, power from about 100 to 2,000 Watts, deposition rates from 100 to 2,000 Angstroms/min, with a film thickness range from 500 to 3,000 Angstroms. These seed layer deposition conditions are similar to the conditions that are used for the barrier layer. The above described method has applications for both MOSFET CMOS memory and logic devices.

The next processing step in building of the dual damascene structure, is the preferential deposition of copper (not shown in figs.) upon the seed layer and barrier layer, by electrochemical copper deposition (ECD). The final processing step in building the dual damascene structure, is the chemical mechanical polishing (CMP) back of the excess electrochemical deposited copper metal, with the copper remaining inlaid in the open trench and via regions. This process can include planarization by chemical mechanical polish, milling, ion milling, and/or etching. Furthermore, multilevel conducting structures are fabricating by repeating steps described above.

Typical deposition conditions for electrochemical deposition (ECD) of copper deposition condition details are: temperature from 10 to 30° C., deposition rate from 2,000 to 5,000 Angstroms/min, copper thickness from 3,000 to 20,000 Angstroms, Cu grain size from 0.5 to 3 microns, Cu crystal preferred orientation (111), re-crystallization near room temperature, 20° C.

While the invention has been particularly shown and described with reference to the preferred embodiments thereof, it will be understood by those skilled in the art that various changes in form and details may be made without departing from the spirit and scope of the invention.

What is claimed is:

1. A method for fabricating IC's comprising the following steps:
    (a) providing a substrate with a first insulating layer of silicon oxide over the substrate;
    (b) providing a first level of conducting material defined and embedded in a second insulating layer over the first insulating layer;

(c) depositing a first intermetal dielectric layer over the second insulating layer;

(d) patterning the first intermetal dielectric layer, forming via openings;

(e) depositing and defining a metal barrier layer in the via openings;

(f) coating with negative photoresist the top surface of first intermetal dielectric and filling the via openings;

(g) exposing and developing the negative photoresist so that the negative photoresist remains in the via openings;

(h) depositing a second intermetal dielectric layer;

(i) patterning the second intermetal dielectric layer, forming trench openings;

(j) stripping-off said negative photoresist, thus forming open trench and open via regions for subsequent conducting metal fill.

2. The method of claim 1, wherein said substrate is semiconductor single crystal silicon or an IC module.

3. The method of claim 1, wherein said conducting material is selected from a group consisting of: metal wiring or contacts of Cu, AlCu alloys, AlCUSi alloys, W, polysilicon, silicide, and P-N junction diffusion regions.

4. The method of claim 1, wherein the insulating layers and intermetal dielectric layers are comprised of silicon oxide.

5. The method of claim 1, further comprising depositing and defining a metal barrier layer in the via openings and trench openings, which is a diffusion barrier liner that aids adhesion, deposited by sputtering, and is comprised of: Ta, or TaN, thickness from 500 to 3,000 Angstroms.

6. The method of claim 1, wherein said negative photoresist used to coat and partially fill the via openings, protects the metal barrier layer, and is comprised of a negative photoresist using a negative resist process.

7. The method of claim 1, wherein said second intermetal dielectric layer is patterned and etched forming trench openings using a reverse tone process.

8. The method of claim 1, wherein said second intermetal dielectric layer is patterned and etched to form trench openings using a negative photoresist and negative photoresist process.

9. The method of claim 1, further comprising depositing and defining a copper seed layer, in the via and trench openings, comprised of thin copper, thickness from 500 to 3,000 Angstroms.

10. The method of claim 1, further comprising depositing a conducting metal fill of electrochemically deposited copper upon a copper seed layer, in the via and trench openings, thickness from 3,000 to 20,000 Angstroms, forming an excess of copper over the vias and trenches.

11. The method of claim 1, further comprising planarizing an excess of copper over the vias and trenches by chemical mechanical polish, milling, ion milling, and/or etching, forming inlaid dual damascene conducting metal interconnects and contact vias in the vias and trenches.

12. The method of claim 1, wherein multilevel structures are fabricating by repeating steps (c) through (j), described above.

13. A method of fabricating an integrated circuit with a dual damascene process that protects a metal barrier layer, the method comprising the following steps:

(a) providing a substrate with a first insulating layer over the substrate;

(b) providing a first level of conducting material comprised of copper wiring defined and embedded in a second insulating layer over the first insulating layer;

(c) depositing a first intermetal dielectric layer of silicon oxide over the second insulating layer;

(d) patterning by reactive ion etching the first intermetal dielectric layer, forming via openings;

(e) depositing and defining a metal barrier layer of Ta or TaN in the via openings;

(f) coating with negative photoresist the top surface of first intermetal dielectric and filling the via openings;

(g) exposing and developing the negative photoresist so that the negative photoresist remains in the via openings;

(h) depositing a second intermetal dielectric layer;

(i) patterning the second intermetal dielectric layer, forming trench openings;

(j) stripping-off said negative photoresist by plasma ashing, thus forming in a dual damascene process open trench and open via regions with a protected metal barrier layer, for subsequent conducting metal fill.

14. The method of claim 13, wherein said substrate is semiconductor single crystal silicon or an IC module.

15. The method of claim 13, wherein said conducting material is selected from a group consisting of: metal wiring or contacts of Cu, AlCu alloys, AlCuSi alloys, W, polysilicon, silicide, and P-N junction diffusion regions.

16. The method of claim 13, wherein the insulating layers and intermetal dielectric layers are comprised of silicon oxide.

17. The method of claim 13, further comprising depositing and defining a metal barrier layer in the via openings and trench openings, which is a diffusion barrier liner that aids adhesion, deposited by sputtering, and is comprised of: Ta, or TaN, thickness from 500 to 3,000 Angstroms.

18. The method of claim 13, wherein said negative photoresist used to coat and partially fill the via openings, protects the metal barrier layer, and is comprised of a negative photoresist using a negative resist process.

19. The method of claim 13, wherein said second intermetal dielectric layer is patterned and etched forming trench openings using a reverse tone process.

20. The method of claim 13, wherein said second intermetal dielectric layer is patterned and etched to form trench openings using a negative photoresist and negative photoresist process.

21. The method of claim 13, further comprising depositing and defining a copper seed layer, in the via and trench openings, comprised of thin copper, thickness from 500 to 3,000 Angstroms.

22. The method of claim 13, further comprising depositing a conducting metal fill of electrochemically deposited copper upon a copper seed layer, in the via and trench openings, thickness from 3,000 to 20,000 Angstroms, forming an excess of copper over the vias and trenches.

23. The method of claim 13, further comprising planarizing an excess of copper over the vias and trenches by chemical mechanical polish, milling, ion milling, and/or etching, forming inlaid dual damascene conducting metal interconnects and contact vias in the vias and trenches.

24. The method of claim 13, wherein multilevel structures are fabricating by repeating steps (c) through (j), described above.

25. A method of fabricating an integrated circuit with a dual damascene process that protects a metal barrier layer, for applications in MOSFET CMOS memory and logic devices, the method comprising the following steps:

a) providing a substrate with a first insulating layer over the substrate;

(b) providing a first level of conducting material comprised of copper wiring defined and embedded in a second insulating layer over the first insulating layer;

(c) depositing a first intermetal dielectric layer of silicon oxide over the second insulating layer;

(d) patterning by reactive ion etching the first intermetal dielectric layer, forming via openings;

(e) depositing and defining a metal barrier layer of Ta or TaN in the via openings;

(f) coating with negative photoresist the top surface of first intermetal dielectric and filling the via openings;

(g) exposing and developing the negative photoresist so that the negative photoresist remains in the via openings;

(h) depositing a second intermetal dielectric layer;

(i) patterning the second intermetal dielectric layer, forming trench openings;

(j) stripping-off said negative photoresist by plasma ashing, thus forming in a dual damascene process open trench and open via regions with a protected metal barrier layer, for subsequent conducting metal fill, for electronic applications.

26. The method of claim 25, wherein said substrate is semiconductor single crystal silicon or an IC module.

27. The method of claim 25, wherein said conducting material is selected from a group consisting of: metal wiring or contacts of Cu, AlCu alloys, AlCuSi alloys, W, polysilicon, suicide, and P-N junction diffusion regions.

28. The method of claim 25, wherein the insulating layers and intermetal dielectric layers are comprised of silicon oxide.

29. The method of claim 25, further comprising depositing and defining a metal barrier layer in the via openings and trench openings, which is a diffusion barrier liner that aids adhesion, deposited by sputtering, and is comprised of: Ta, or TaN, thickness from 500 to 3,000 Angstroms.

30. The method of claim 25, wherein said negative photoresist used to coat and partially fill the via openings, protects the metal barrier layer, and is comprised of a negative photoresist using a negative resist process.

31. The method of claim 25, wherein said second intermetal dielectric layer is patterned and etched forming trench openings using a reverse tone process.

32. The method of claim 25, wherein said second intermetal dielectric layer is patterned and etched to form trench openings using a negative photoresist and negative photoresist process.

33. The method of claim 25, further comprising depositing and defining a copper seed layer, in the via and trench openings, comprised of thin copper, thickness from 500 to 3,000 Angstroms.

34. The method of claim 25, further comprising depositing a conducting metal fill of electrochemically deposited copper upon a copper seed layer, in the via and trench openings, thickness from 3,000 to 20,000 Angstroms, forming an excess of copper over the vias and trenches.

35. The method of claim 25, further comprising planarizing an excess of copper over the vias and trenches by chemical mechanical polish, milling, ion milling, and/or etching, forming inlaid dual damascene conducting metal interconnects and contact vias in the vias and trenches.

36. The method of claim 25, wherein multilevel structures are fabricating by repeating steps (c) through (j), described above.

* * * * *